United States Patent [19]

Dreyfus et al.

[11] 4,240,007
[45] Dec. 16, 1980

[54] MICROCHANNEL ION GUN

[75] Inventors: Russell W. Dreyfus, Mt. Kisco; Nicholas A. Penebre, Chappaqua; Richard A. McCorkle, South Salem, all of N.Y.

[73] Assignee: International Business Machines Corporation, Armonk, N.Y.

[21] Appl. No.: 53,496

[22] Filed: Jun. 29, 1979

[51] Int. Cl.³ .................. H01J 27/02; H01J 43/02
[52] U.S. Cl. .................. 315/111.8; 313/105 CM; 313/230; 313/362
[58] Field of Search .................. 315/111, 111.8, 111.9; 313/359, 362, 103 CM, 105 CM, 230; 328/227; 60/202

[56] References Cited

U.S. PATENT DOCUMENTS

| 2,945,951 | 7/1960 | Bright | 313/230 |
| 2,960,614 | 11/1960 | Mallinckrodt | 315/111 |
| 2,969,480 | 1/1961 | Klein | 315/111.9 |
| 3,233,404 | 2/1966 | Huber et al. | 313/362 X |
| 3,271,661 | 9/1966 | Goodrich et al. | 313/103 CM X |
| 3,387,176 | 6/1968 | Currie et al. | 315/111 |
| 3,597,650 | 8/1971 | Anderson et al. | 315/111 |
| 3,617,789 | 11/1971 | Middleton et al. | 313/230 X |
| 4,031,428 | 6/1977 | Tokudome et al. | 315/111 |

OTHER PUBLICATIONS

Bouchard et al., *Self-Triggered Channel Ion Source*, Rev. Sci. Instrum., vol. 50, No. 1, Jan., 1979, pp. 99–101.
Ono et al., *The Energy Dependence of Secondary Emission . . . Power Formula*, J. Phys. D:Appl. Phys., vol. 12, pp. 619–631, 1979.
Becker et al., *Preparation and Characteristics of a Channel Electron Multiplier*, Rev. Sci. Instrum., vol. 43, No. 11, Nov., 1972, pp. 1587–1589.

*Primary Examiner*—Eugene R. LaRoche
*Attorney, Agent, or Firm*—Michael J. Weins

[57] ABSTRACT

The present invention describes an ion gun which is capable of producing relatively high density ion currents. The ion gun employs at least one capillary duct the surface of which is semiconducting and has secondary electron emission coefficient greater than one to generate ions from a source of an ionizable material and to accelerate the ions so generated.

13 Claims, 2 Drawing Figures

MICROCHANNEL ION GUN

DESCRIPTION

1. Technical Field

The present invention relates to an ion gun and more particularly to an ion gun employing at least one capillary duct by means of which a relatively high density ion current can be obtained.

2. Background Art

Ion guns have employed tubes with a potential applied between their ends to accelerate the ions. These devices are generally limited in the ion current density which they produce. One such device is that of S. Klein which is described in U.S. Pat. No. 2,969,480. However, his device requires a resonating cavity to generate the ions. In this case the resonating cavity limits the beam intensity.

Higher ion densities have been obtained by the method of H. Haber et al which is described in U.S. Pat. No. 3,233,404. The ion gun they describe employs a capillary tube which is made of a refractory metal. This tube ionizes a gas as it passes through it. In order to make the tube operational it is necessary to heat it to an elevated temperature. The '404 patent reports that heating a tantalum tube 0.4 mm in diameter and 10 mm in length to 2100° K. while feeding cesium gas through the tube will produce ion current densities in the order of 1 A/cm$^2$. This device is limited in the ions that can be generated since the gas must be ionized by the refractory metal surface. A further limitation is that the ions are thermally activated giving rise to a wide distribution in their energies.

C. Bouchard and J. D. Carette in an article entitled "Self-Triggered Channel Ion Source" published in Rev. Sci. Instrum., 50 (1) pp. 99-101 (Jan. 1979), have reported that a continuous dynode electron multiplier of the straight channel type and an ion reflector will operate as an ion source. To operate the device the ion source must be placed in a vacuum system where the pressure typically exceeds 10$^{-5}$ torr. The Bouchard et al source is limited to ion currents of approximately 10$^{-3}$ A/cm$^2$ with the resulting ions having a large distribution in their energies. Furthermore, this technique as well as the other above described technique operates only over a very limited pressure range thus further limiting the utility of the technique currently available.

DISCLOSURE OF INVENTION

It is an object of the present invention to provide an ion gun which provides a large ion current while maintaining a small beam size.

It is another object of this invention to provide an ion gun which is capable of effectively operating over a broad pressure range from ultra high vacuum pressures to as high as about 0.5 torr.

Still another object of the present invention is to provide an ion gun which produces ions with a narrow energy spread.

A further object of the present invention is to provide an ion gun wherein the energy level of the ion is adjustable allowing one to select the energy level at which the ions are emitted.

Yet a further object of the invention is to provide an ion gun well suited to writing patterns on the surface of the target.

Another object of this invention is to provide an ion gun which can be placed in close proximity to another ion gun so as to produce a close packed array of ion guns.

These and other objects and advantages of the invention will become apparent from the following description, accompanying drawings, and the appended claims in which the various novel features of the invention are more particularly set forth.

In one embodiment of the present invention the ion gun has a high resistance body which has a first and second end. A first electrode is attached to the first end and a second electrode is attached to the second end. A capillary passage generates a surface which passes through the first electrode, the low conductivity body, and the second electrode. The surface so generated has a composition such that the surface is partially conducting and has a secondary electron emission coefficient greater than unity. The ion gun has a means to maintain the first electrode at a potential which is above the second electrode. A source of ionizable material communicates with the first electrode and provides the desired ions.

It is preferred that the capillary passage has a characteristic transverse dimension of not greater than about 200 microns and a length such that the resulting aspect ratio of the capillary passage is between about 100 to 1 and 1000 to 1.

Another embodiment of the present invention is particularly well suited to writing patterns. In this embodiment the high resistance body has multiple parallel capillary passages through it and its associated electrodes. Again the surfaces generated by these capillary passages are partially conducting and have a secondary emission coefficient greater than unity. In all other respects the ion generator of the present embodiment is similar to that described above.

BEST MODES FOR CARRYING OUT THE INVENTION

Figure 1:
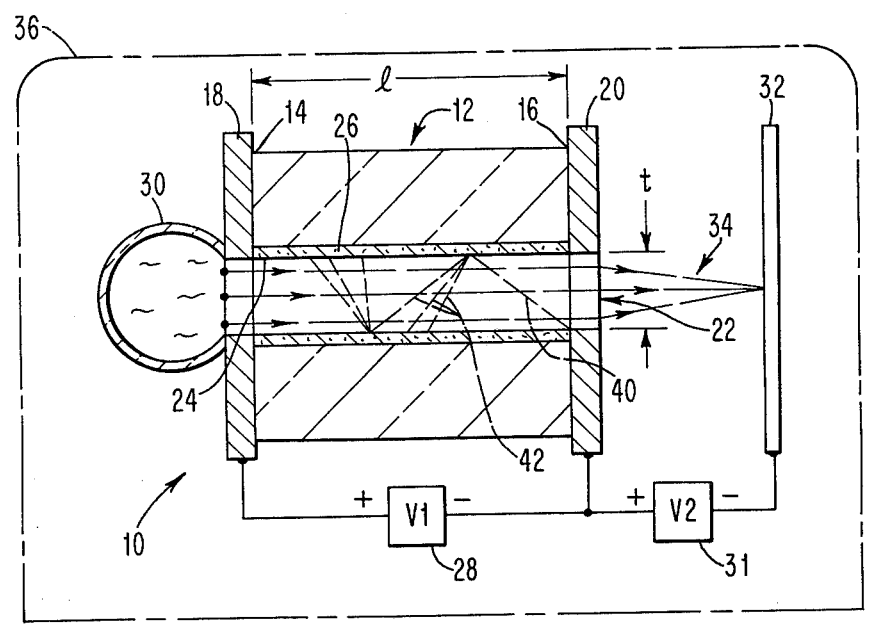
FIG. 1 shows one embodiment of the invention; and,
FIG. 2 shows a second embodiment of the invention.

One embodiment of the present invention is illustrated in FIG. 1. An ion gun 10 has a high resistance body 12 with a first end 14 and a second end 16 which are spacially separated. Attached to the first end 14 is a first electrode 18 and similarly attached to the second end 16 is a second electrode 20. Preferably the high resistance body 12 has a resistance of greater than about 10$^6$ Ω when measured by placing a potential between the first electrode 18 and the second electrode 20. Typical materials suitable for fabrication of the low conductivity bodies are glasses, plastics, ceramics or semiconductors.

A capillary passage 22 passes through the first electrode 18, the high resistance body 12 and the second electrode 20. The capillary passage 22 has a surface 24 with a composition such that the surface which is partially conducting has a secondary emission coefficient greater than unity. The conduction characteristics of the surface 24 should be such that the overall resistance for the high resistance body 12 with the capillary passage 22 will be between about 10$^6$ and 10$^{10}$ Ω when measured between the first electrode 18 and the second electrode 20. This overall resistance may result from the characteristics of the high resistance body 12 or alternatively may be obtained by providing a region 26 immediately adjacent to the surface 24 where the composition is adjusted so as to provide the desired characteristics.

It is desirable for the surface 24 of the capillary passage 22 to have a high work function. This will avoid erosion of the surface by electrons and ions which pass through capillary passage 22. For this purpose it is advisable to have the surface 24 contain elements with high work function such as lead, bismuth and platinum. Furthermore, incorporation of these elements into the surface 24 generally increases the secondary electron emission (see "The Energy Dependence of Secondary Emission Based on the Range-Energy Retardation Power Formula", J. Phys. D: Appl. Phys., Vol. 12, 1979, pp. 619–632).

When it is desired to provide a region 26 adjacent to the surface 24 having the above described characteristics, the capillary passage 22 may be coated with an oxide of a high work function metal. The oxide is subsequently partially reduced in a hydrogen atmosphere to form the partially conducting region 26 (for greater detail of this technique see "Preparation and Characteristics of a Channel Electron Multiplier" by Becker et al, The Review of Scientific Instruments, Vol. 43, No. 11, November 1972, pp. 1587–1589).

It is preferred that the capillary passage 22 having a characteristic transverse dimension not greater than 200 microns and a length l such as an aspect ratio of the capillary passage between about 100 to 1 and 1000 to 1. If a cylindrical passage 22 is employed as is illustrated in FIG. 1, then the characteristic transverse dimension would be the diameter t of the capillary passage 22. If other cross sections such as a triangular cross section, or a hexagonal cross section is employed then the characteristic dimension would be the diameter of an inscribed circle. The only limitation on the cross section geometry is that it will produce multiplication of the electrons as they pass down the passageway 22.

The first electrode 18 is maintained at a potential above the second electrode 20 by a first voltage source 28 or alternative means of maintaining a potential therebetween.

Figure 2:
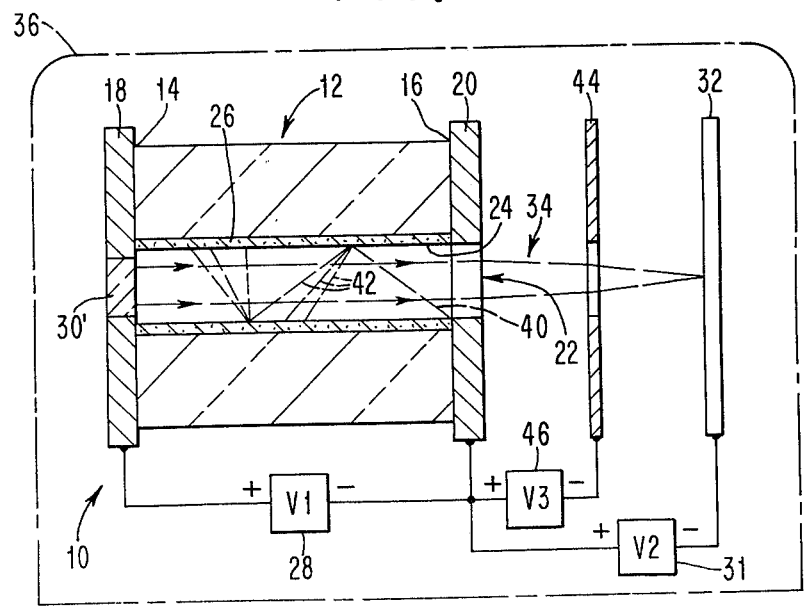

A source of ionizable material is located adjacent to the first electrode 18 and communicating with the capillary passage 22. The source may be either a reservoir 30 containing gas or liquids as is illustrated in FIG. 1 or alternatively may be ionizable solid 30' as is illustrated in FIG. 2. This solid must be selected so that it will ionize when exposed to an electron flux.

Typical examples of monatomic gases particularly well suited for use with the present device are the noble gases (e.g. argon, krypton and xenon) which form atomic ions, and low molecular weight organic gases (e.g. methane and propane) which form molecular ions.

When liquids and solids are employed low work function materials are particularly desirable. Examples of liquids that meet this criterion are potassium, gallium, and cesium. For solids, some typical examples are barium, beryllium and calcium.

A second voltage source 31 which maintains a target 32 at a potential different than the second electrode 20 is employed when alteration of the focus of the ion beam 34 is desired.

To operate, the ion gun 10 is placed in a vacuated chamber 36 illustrated by the broken line and the pressure reduced to 0.5 torr or below. There is no lower limit placed on the pressure under which the ion gun 10 will operate. When the second electrode 20 is maintained at a potential below the first electrode 18 by the first voltage source 28, electrons are emitted from the second electrode 20. These electrons 40 will impact the surface 24 of the capillary passage 22. Upon impact additional electrons 41 will be generated giving rise to a cascade effect. Each of these electrons 41 will in turn multiply as they move down the capillary passage 22 towards the first electrode 18. The electrons which have been generated and accelerated in the capillary passage 22 interact with the atomic species in the reservoir 30 causing ionization of the species. The ions in turn are propagated back through the capillary passage 22 by the potential between the first electrode 18 and the second electrode 20. A small fraction of these ions will strike the second electrode 20 generating additional electrons which maintain an electron current. Electron generation at the second electrode will also be stimulated by photoemission from the light emitted by the ion source during ionization events. The majority of the ions will be projected from the ion gun 10 forming a beam 34 which in turn impacts the target 32.

When it is desired to further focus the ion beam 34, a second voltage source 31 maintains the second electrode 20 at a potential above that of the target 32. Conversely, when the second voltage source 31 maintains the second electrode 20 at a potential lower than the target 32, the beam 34 will be defocused and the size will be increased. For the optimal focusing it is preferred to employ the first voltage source 28 and the second voltage source 31 where their voltage output is in the ratio of about 1 to 9.

For effective operation of the ion gun 10 where the overall resistance between the first electrode 18 and the second electrode 20 is adjusted to about $10^6$ to $10^{10}$ $\Omega$, it is desired that the first voltage source 28 provide a potential of between about 200 v and 5000 v. When the lower limit of 200 v is maintained by the first voltage source 28 and no secondary voltage source 31 is applied then it is possible to produce a high flux ion beam where the ions have relatively low energies. Conversely, when the first voltage source is maintained at a high level, say approximately 5000 v, and the beam is further focused by the second voltage source, it is possible to obtain a highly focused beam 34 with very energetic ions.

FIG. 2 is a second embodiment of the present invention which is particularly useful for applications where it is desired to have a highly focused beam 34 while maintaining a relatively low energy for the ionic species. As can be seen by comparison of FIG. 2 and FIG. 1 the two embodiments have many similarities. The second embodiment employs a low conductivity body 12 with a first end 14 and a second end 16. Attached to the first end is a first electrode 18 and attached to the second end 16 is a second electrode 20. Again, a first voltage source 28 maintains a potential between the first electrode 18 and the second electrode 20. The source of ions for the second embodiment is an ionizable solid material 30' which when bombarded with electrons will emit ions.

This embodiment differs from the first embodiment in that a means for focusing the ions is incorporated between the second electrode 20 and the target 32. Typically, this will be one or more focusing electrodes. For purpose of illustration, one focusing electrode 44 is illustrated in FIG. 2. For this configuration the second voltage source 31 maintains a potential between the second electrode 20 and the target 32 while a third voltage source 46 is employed to maintain the second electrode 20 at a potential different than that of the focusing electrode 44. When the voltage is maintained such that the focusing electrode 44 is at a potential below the second electrode 20, further focusing of the ion beam 34 will result.

While the first and second embodiment employ a single capillary passage 22 to generate ions, a plurality of parallel capillary passages could be equally well placed in the low conductivity element 12. This would give rise to a series of parallel beams which will impinge upon the target.

Industrial Applicability

The ion source of the present invention is well suited to a variety of industrial applications. Particularly, likely applications would be the semiconductor industry, the material processing industry, and the material testing industry.

The electronics and in particular the semiconductor industry uses ion sources for sputter deposition, sputter etching, ion assisted etching and chemical etching. These techniques are extensively used in fabrication of electronic devices. The electronics industry also employs ion beams for ion implantation, for information storage and retrieval, for doping semiconductors and for creating damaged regions to modify the surface properties of the resulting device.

The material processing industry uses ion beams to treat plastic surfaces changing their properties; to treat the surface of metals by ion bombardment creating an amorphous layer on the surface which may increase corrosion resistance or otherwise change the surface properties; and to implant ions at and near the surface to change the chemical composition altering the physical properties of the material.

The testing industry employs ion beams to selectively remove layers of a material for analysis. These layers can be individually studied allowing profiles of the variations in the chemistry to be developed.

While the novel features of the invention have been described in terms of preferred embodiments and in particular industrial applications, it will be appreciated that various omissions and substitutions in form and in details of the device illustrated or other applications may be made by those skilled in the art without departing from the spirit of the invention.

Having thus described our invention, what we claim as new, and desire to secure by Letters Patent is:

1. An ion gun for locally exposing a target which comprises:
   a high resistance body having a first and a second end which are specially separated;
   a first electrode attached to said first end;
   a second electrode attached to said second end;
   a capillary passage having a surface which passes through said first electrode, said high resistance body, and said second electrode,
      said surface having a composition such that it is partially conducting and has a secondary electron emission coefficient greater than unity;
   means for maintaining said first electrode at an electric potential above said second electrode; and
   a source of ionizable material adjacent to said first electrode and communicating with said capillary passage.

2. The ion gun of claim 1 which further comprises:
   a region adjacent to said surface wherein the composition differs from that of the high resistant body and renders said surface partially conducting.

3. The ion gun of claim 2 wherein said high resistivity body provides a resistance of not less than $10^6$ Ω along a path between said first electrode and said second electrode while said region adjacent to said surface reduces the overall resistance along said path to about $10^6$ Ω to $10^{10}$ Ω.

4. The ion gun of claim 1 wherein said capillary passage has a characteristic transverse dimension of not greater than 200 microns and a length such that the resulting aspect ratio of said capillary passage is between about 100 to 1 and 1000 to 1.

5. The ion gun of claim 4 wherein said capillary passage is cylindrical and said characteristic transverse dimension is its diameter.

6. The ion gun of claim 4 wherein said means for maintaining said first electrode at an electric potential above said second electrode is a first voltage source, and which further comprises:
   a second voltage source to maintain the target at a potential below said second electrode.

7. The ion gun of claim 6 wherein said first voltage source and said second voltage source is in the ratio of about 1 to 9.

8. The ion gun of claim 6 which further comprises:
   means for focusing ions between said second electrode and said target.

9. The ion gun of claim 8 wherein said means for focusing ions comprises:
   a focusing electrode positioned between said target and said second electrode;
   a third voltage source to maintain said focusing electrode at an electric potential below said second electrode.

10. The ion gun of claim 4 wherein said source of ionizable material is a reservoir containing the species to be ionized.

11. The ion gun of claim 4 wherein said source of ionizable material is a material which will emit ions when subject to electron bombardment.

12. An ion gun for exposing a target which comprises:
   a high resistance body having a first and second end which are spacially separated;
   a first electrode attached to said first end;
   a second electrode attached to said second end;
   a plurality of parallel capillary passages having surfaces which have secondary electron emission coefficients greater than unity and pass through said first electrode, said low conductivity body and said second electrode,
      said capillary passages having a characteristic transverse dimension not greater than 200 microns and a length such that the resulting aspect ratio of said capillary passing is between about 100 to 1 and 1000 to 1;
   a voltage source connected between said first and second electrode to maintain said first electrode at an electric potential above said second electrode; and
   a source of ionizable material adjacent to said first electrode and communicating with said capillary passage.

13. The ion gun of claim 12 which further comprises:
   regions adjacent to said surfaces where the composition differs from that of the high resistivity body and renders said surface partially conducting.

* * * * *